United States Patent [19]
Birge et al.

[11] Patent Number: 5,253,198
[45] Date of Patent: Oct. 12, 1993

[54] THREE-DIMENSIONAL OPTICAL MEMORY

[75] Inventors: Robert R. Birge, Fayetteville; Deshan S. K. Govender, Skaneateles, both of N.Y.

[73] Assignee: Syracuse University, Syracuse, N.Y.

[21] Appl. No.: 811,065

[22] Filed: Dec. 20, 1991

[51] Int. Cl.[5] .................. G11C 13/00; G11B 7/00
[52] U.S. Cl. .................... 365/106; 365/125; 369/100; 369/121
[58] Field of Search ............... 365/106, 125, 215, 216, 365/217, 234; 369/100, 121

[56] References Cited

U.S. PATENT DOCUMENTS

| | | | |
|---|---|---|---|
| 3,851,318 | 11/1974 | Taylor et al. | 365/215 |
| 3,869,193 | 3/1975 | Schmit | 365/215 |
| 4,458,345 | 7/1984 | Bjorklund et al. | 369/103 |
| 4,944,037 | 7/1990 | Ando | 369/100 |
| 4,969,141 | 11/1990 | Takaoka et al. | 369/100 |
| 5,038,321 | 8/1991 | Van Zeghbroeck | 365/106 |
| 5,121,376 | 1/1992 | Kuder et al. | 365/106 |

OTHER PUBLICATIONS

Birge, *Nature of the primary photochemical events in rhodopsin and bacteriorhodopsin,* Biochimica et Biophysica Acta.
Birge, *Photophysics and Molecular Electronic Applications of the Phodopsins,* Annu. Rev. Phys. Chem. 1990.
Parthenopoulos et al., *Three Dimensional Optical Storage Memory* Department of Chemistry, University of California.

*Primary Examiner*—Eugene R. LaRoche
*Assistant Examiner*—Son Dinh
*Attorney, Agent, or Firm*—Wall and Roehrig

[57] ABSTRACT

A high density rapid access data storage device employs a volume of field-oriented bacteriorhodopsin in a polymer medium, and contained in a vessel that can be accurately displace in three dimensions. X-axis and Y-axis laser illumination systems each converge a beam in the respective direction at a location at which a particular bit cell is to have a "1" or "0" recorded or is to be interrogated. Both laser systems are pulsed on at one wavelength to write a "1" or at a second wavelength to write a "0". After writing, a cleaning step is carried out by actuating the laser systems non-simultaneously at the other of the wavelengths to remove any undesired photochemistry from adjacent bit cells. A read cycle involves actuating two or four lasers, and then discriminating the "1" or "0" state from the electrical signal generated by the medium.

8 Claims, 5 Drawing Sheets

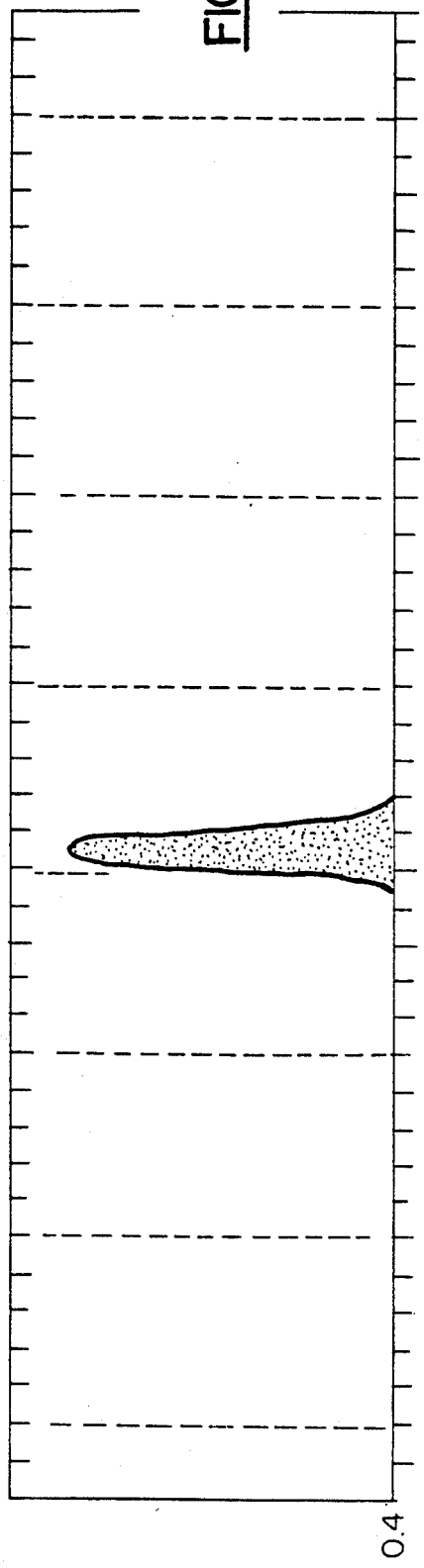
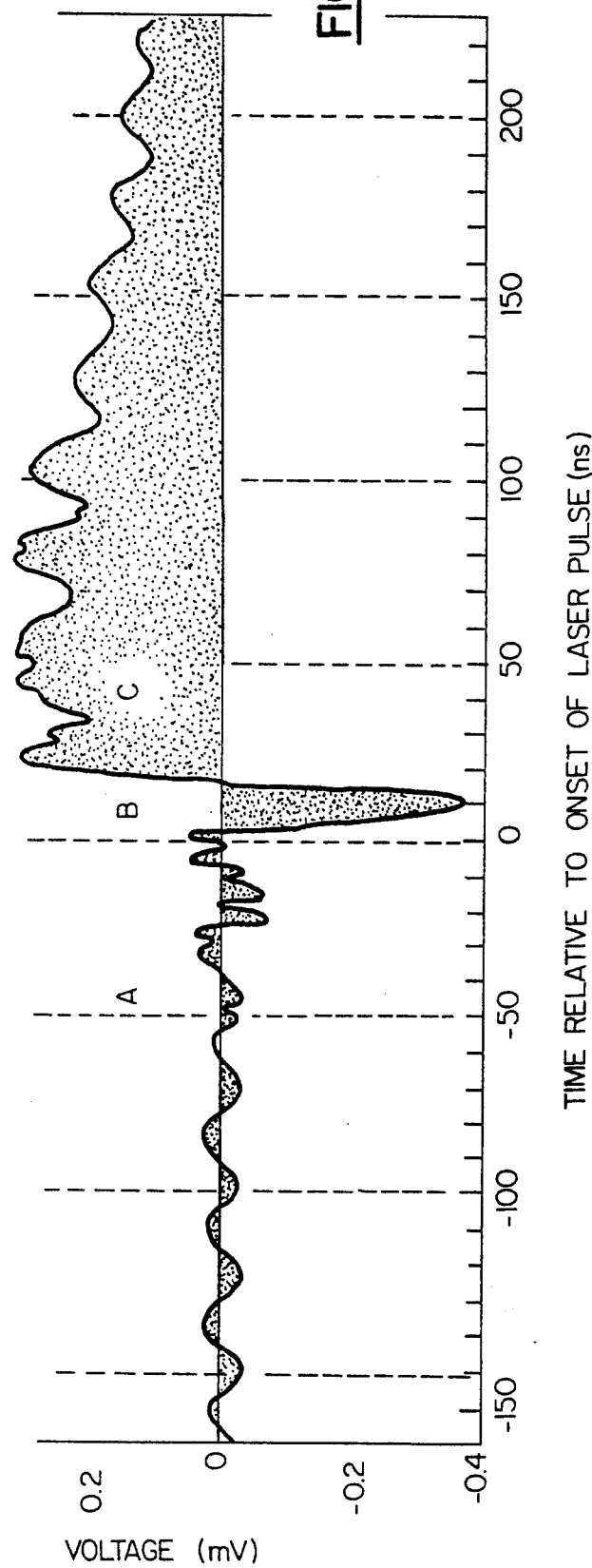
FIG.4A
FIG.4B

THREE-DIMENSIONAL OPTICAL MEMORY

This invention was developed under work in connection with the following grants: Rome Laboratory (USAF) Grant No. F30602-91-C-0084; National Science Foundation Rev Program CHE-8900471; National Institutes of Health Grant No. GM34548. The government may have certain rights in the invention.

BACKGROUND OF THE INVENTION

This invention relates to high density random access data storage, and is more especially directed to an optical memory system in which laser light is employed to write and read data via two-photon processes within an irradiated volume which can be controllably displaced in three dimensions. A key feature of this optical memory is the use of a light-sensitive protein called bacteriorhodopsin. This protein is capable of being oriented and can emit an electric signal indicative of the binary state of an irradiated volume.

A number of attempts have been made to produce optical memories that employ non-linear optical processes. U.S. Pat. No. 4,458,345 describes a two-photon process within an irradiated volume that exposes a sensitized medium. The medium is a four-level material, and the two-photon process generates a microscopic interference pattern. The gating property of the two-photon photochemistry provides for nondestructive reading. Patterns can be produced at several depths below the surface, and thus a three-dimensional capability is possible.

Another two-photon three-dimensional memory has been proposed based on the use of two distinct photochemical forms of spirobenzopyran. In this approach, the storage medium is an unoriented organic chromophore in a polymer matrix. The writing process involves a two-photon induced photochemical change involving heterolytic cleavage, the read process is based on the observation of fluorescence from the merocyanine form, and there are blurring effects from the two-photon induced photochemistry that occurs in adjacent bit cells outside of the irradiated volume.

OBJECTS AND SUMMARY OF THE INVENTION

It is an object of this invention to provide a high density two-photon photochromic random access memory which is reliable, efficient and provides a significant increase in data storage capacity.

It is another object of this invention to provide a high density optical random access memory that can employ lasers of low to moderate power for write, read and erase operations.

It is a further object of this invention to provide a high density optical random access memory in which the states of the data cells are maintained unambiguously after a large number of read/write operations.

Bacteriorhodopsin which is used as the active phototropic agent has a molecular weight of approximately 26,000 D and is the light transducing protein in the purple membrane of Halobacterium halobium. This halophilic archaebacterium grows in salt marshes where the concentration of NaCl can exceed 4M, roughly six times higher than seawater ([18]0.6M NaCl). The purple membrane, which contains the protein bacteriorhodopsin in a lipid matrix, is grown by the bacterium when the concentration of oxygen becomes too low to sustain the generation of ATP via oxidative phosphorylation. Absorption of light by light-adapted bacteriorhodopsin generates a photocycle which pumps protons across the membrane, with a net transport from the inside (cytoplasmic) to the outside (extracellular) of the membranes. The resulting pH gradient ($\Delta$pH[181]) generates a proton-motive force which is used by the bacterium to synthesize ATP from inorganic phosphate and ADP.

The use of bacteriorhodopsin as an optical storage medium has been examined previously, and the use of bacteriorhodopsin as a two-dimensional random access memory storage medium has been described in commonly-assigned patent application Ser. No. 644,500. The intrinsic properties of the native bacteriorhodopsin protein make it an outstanding candidate for use in an optically coupled device. These properties include: (1) long-term stability of the protein to thermal and photochemical degradation, (2) picosecond photochemical reaction times at reduced temperatures (both the forward and reverse photoreactions produce stable products in less than 5 picoseconds at 77K), (3) high forward and reverse quantum yields permitting the use of low light levels for switching, (4) wavelength-independent quantum yields, (5) a large shift in the absorption-spectrum-accompanying photochemistry which permits accurate and reproducible assignment of state, (6) high two-photon cross sections permitting activation in the infrared and three-dimensional digital optical memories, (7) high second order polarizabilities which open up nonlinear optical applications, (8) the ability to form thin films of bacteriorhodopsin with excellent optical properties by using the Langmuir-Blodgett, polymer heatpress or polymer matrix spin coating techniques and (9) the ability to form large cubes or rectangular solids of oriented bacteriorhodopsin by using electrophoretic techniques. The following paragraphs described these properties in greater detail.

The native protein, when isolated from the purple membrane and cooled to [18]$-40°$ C., or at higher temperatures in the presence of chemical additives (see below) which prevent M decay, displays the following one-photon induced photochemical equilibrium:

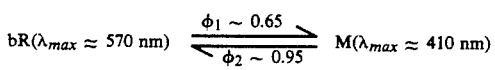

where bR represents the light-adapted form of the modified protein, and M represents the blue-shifted (deprotonated) intermediate. The quantum yield of the forward reaction is indicated by $\phi_1$ and the quantum efficiency of the reverse reaction is indicated by $\phi_1$. The absorption maxima are approximate because these values are altered by environment and chromophobe analog. This photochemical interconversion can be initiated via two-photon processes. Under two-photon excitations, the photochemical equilibrium is as follows:

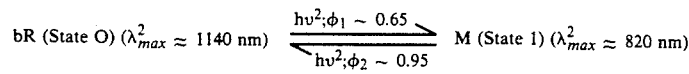

We arbitrarily assign bR to binary state "0" and M to binary state "1." An important observation is that the chromophore in bR has an unusually large two-photon absorptivity which is approximately ten times larger than absorptivities observed for other polyene chromophores. This permits the use of much lower intensity laser excitation to induce the forward photochemistry. The 820 nm laser must be about five times more intense than the 1140 nm laser. We should note that the above wavelengths can vary by about 40 nm, because the two-photon absorption maxima shift as a function of temperature and polymer matrix water content.

Photoelectric Properties of Bacteriorhodopsin

The photoelectric properties of bacteriorhodopsin derive from two effects. The primary photochemical event involves a photochemical isomerization which induces a fast photovoltage signal which has been measured to have a rise time of a few picoseconds. A larger, slower photoelectric signal of opposite polarity is associated with the proton pumping process that occurs during the formation of the M intermediate. This combination generates a bR→M(0→1) photovoltage. This fast negative signal followed by a slower positive signal provides for state assignment via voltage measurement with an excellent signal to noise ratio. In contrast, if one starts with M, the M→bR transition induces a photovoltage that is similar except that the voltages are reversed. This characteristic provides for unequivocal state assignment based on photovoltage measurement. There are at least four methods which have been used to orient the protein. The most straightforward method takes advantage of the negative charge localized on the cytoplasmic surface of the protein, and can be used with the isolated protein monomer with the trimer or with purple membrane patches. By inducing a small but constant voltage differential across the solution, the proteins or purple membrane patches will migrate and partially orient themselves resulting in the ensemble adhering to the positively charged electrode with the cytoplasmic side oriented towards the electrode. If this orientation is carried out in a polymeric film prior to polymerization, the polymerized system remains oriented after the voltage is removed. A second method is similar, but uses transient voltage pulses to orient the protein in situ without generating migration. The pulse length and the pulse voltage must be varied depending upon the viscosity of the solvent environment and the electrode separation. The approach requires a narrow range of conditions and relies on interprotein electrostatic repulsion as well as Brownian motion to maintain a homogeneous solution (minimal migration) and short high voltage pulse ($^{1}40$K V/cm; 10 $\mu$s) to orient the protein preferentially. A third method takes advantage of anisotropies at the surface of a coated or uncoated piece of glass to orient polymeric thin films. Presumably, the protein will orient at the polymer-glass interface to maximize electrostatic stabilization, and this orientation will extend into the polymer film due to cooperativity effects. A fourth method is based on the Langmuir-Blodgett technique and the fact that the protein orients during the coating process when a phospholipid binder is used. The rotation of the protein at the "oil-water" interface can stabilize the charged amino acids on the C-terminus end within the water layer. The first two methods mentioned above can be used to prepare cubes of bacteriorhodopsin with high degrees of orientation. The protein is oriented by using techniques that are analogous to those used in gel electrophoresis. After orientation, the gel is polymerized by using a chemical polymerizing agent or by using a light activated polymerizing agent.

In accordance with an aspect of this invention there is provided a two-photon, three-dimensional optical memory. The heart of the memory is a three dimensional arrangement of bacteriorhodopsin supported in a suitable polymer such as acrylamide. This combination can also include suitable chemical means to stabilize the bacteriorhodopsin molecule in its energized (M) state. Preferably the arrangement is a 1.6 cm diameter cube contained in a transparent optical glass container. The container is accurately translatable in any of the three orthogonal directions by three actuators which independently drive the cube in the X, Y, or Z direction. For high-speed, low density applications voice-coil actuators can be used as driver actuators. For lower speed, but high density applications, piezoelectric micrometers can be used.

There are also two pairs of laser beam generators employed, one pair generating 820 nm beams in the X and Y axis, respectively to intersect at a given bit cell location, and the other pair generating 1140 nm laser beams that also intersect at that bit cell location. In the described embodiment, the two 1140 nm laser beams are actuated to write a "1" bit, and the two 820 nm laser beams are actuated to write a "0" bit.

To eliminate unwanted photochemistry in adjacent bit cells along the X and Y axes, the other pair of laser beams is actuated, but non-simultaneously, immediately following a write operation.

A read operation is carried out by simultaneous actuation of one pair or of both pairs of the laser beams. For example, the two 1140 nm beams are simultaneously energized to carry out a "0" to "1" write operation on a given bit cell. Then the two 820 nm cleaning pulses are fired. A differential output voltage of the volume is measured for each pulse. If the net output voltage is negative, then the memory cell was originally had been in the "0" state. If the net voltage is positive, then the memory cell was originally in the "1" state.

After the read operation, a write operation is carried out to reset the memory cell to its original bit state.

This procedure serves to enhance data integrity by reducing the risk that multiple read/write cycles in other cells along the axis occupied by the interrogated memory cell might corrupt the data in that memory cell.

To maximize memory reliability, additional error detection and correction bits are stored for each byte (so the total word length can be one eight-bit data byte plus two error correction bits).

The total read process can be completed in under 100 ns, so the maximum data rate can be as high as 10 Mbit/sec. The data rate is limited only by the time required to move the data memory cube.

The above and other objects, features, and advantages of this invention will present themselves to those of skill in the art from a perusal of the ensuing description of a preferred embodiment when read in connection with the accompanying Drawing.

BRIEF DESCRIPTION OF THE DRAWING

FIGS. 4A and 4B are graphs respectively showing the photochemical transformation of the photoactive medium in response to a two-photon write operation in the vicinity of a particular memory bit cell, first before and then after a sequence of cleaning pulses.

Figure 1:
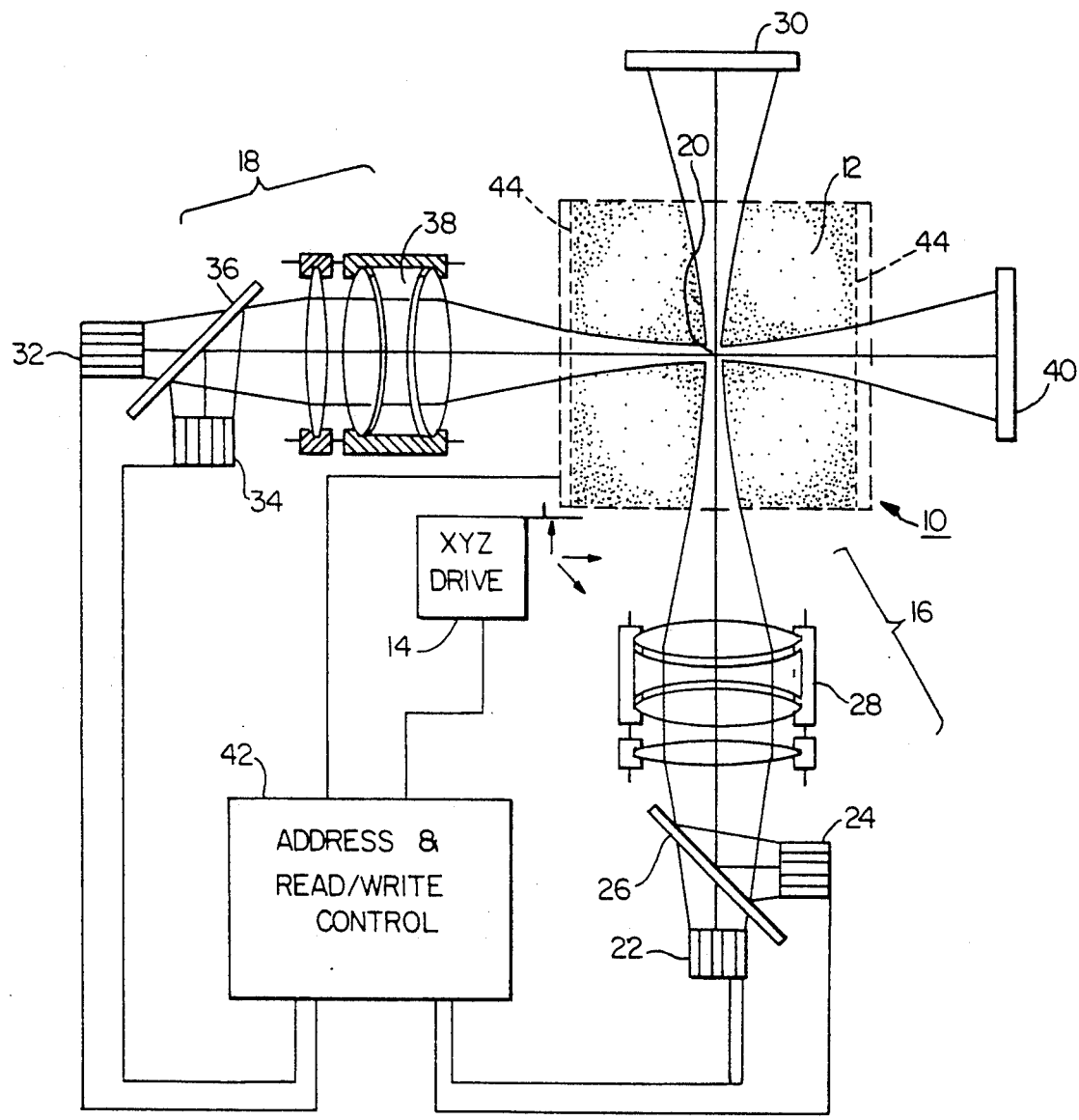
FIG. 1 is a schematic representation of a two-photon, three-dimensional optical memory element according to an embodiment of this invention.

DETAILED DESCRIPTION OF THE PREFERRED EMBODIMENT:

With reference initially to FIG. 1, a memory or data storage element 10 of this invention includes a volume 12 of bacteriorhodopsin which here is in the form of a cube of about 1.6 cm on a side. An X, Y, Z drive mechanism 14 can accurately displace the cube 12 in three orthogonal directions to a high accuracy. That is, where the drive mechanism 14 includes piezoelectric micropositioners, the cube can be positioned reproducibly within an accuracy of about three microns; where voice-coil actuators are employed the cube can be positioned very rapidly to within about seven microns.

A first optical read/write arrangement 16 and a second optical read/write arrangement 18 are disposed with optical axes respectively along the x and y axes and which intersect at a predetermined data bit read/write location 20 within the cube volume 12. The first arrangement 16 has first and second laser diodes 22,24 generating laser beams at 1140 nm and 820 nm, respectively. The latter laser diode 24 reflects its beam via a beam splitter 26 to inject it along the optic axis. A focusing lens arrangement 28 converges the laser beam or beams onto the read/write location 20 (typically less than about three microns in size). The beams then diverge and leave the cube 12, and impinge upon a non-reflecting backstop 30. The second arrangement 18 similarly has third and fourth laser diodes 32, 34 respectively emitting beams at 1140 nm and 820 nm, the latter laser diode 34 having an associated beam splitter 36. A focussing lens arrangement 38 converges the beams onto the read/write location, after which the beams diverge and leave the curve and impinge on a second, non-reflecting backstop 40.

An addressing and read/write control circuit 42, shown here as a block, is coupled to the XYZ drive 14 and to the laser diodes 22, 24, 32, 34 to direct the positioning of the cube 12 and to control the timing of actuation of the laser beam pulses. A pair of flat, transparent electrodes 44 are provided on opposite faces of the cube 12 and are electrically coupled to the circuit 42. The electrodes provide an electrical response when the bit cell at the location 20 is interrogated, and from which the "1" or "0" state of that bit cell can be discriminated.

Figure 2B:
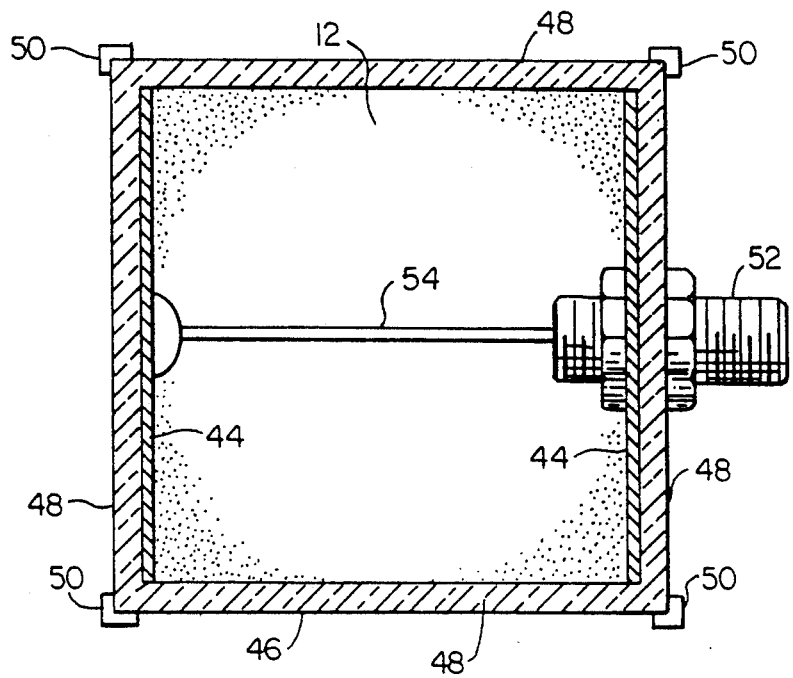
FIGS. 2A and 2B are a sectional elevation and a plan section, the latter taken along 2B—2B of FIG. 2A, to illustrate the photoactive volume of the memory element.
Figure 2A:
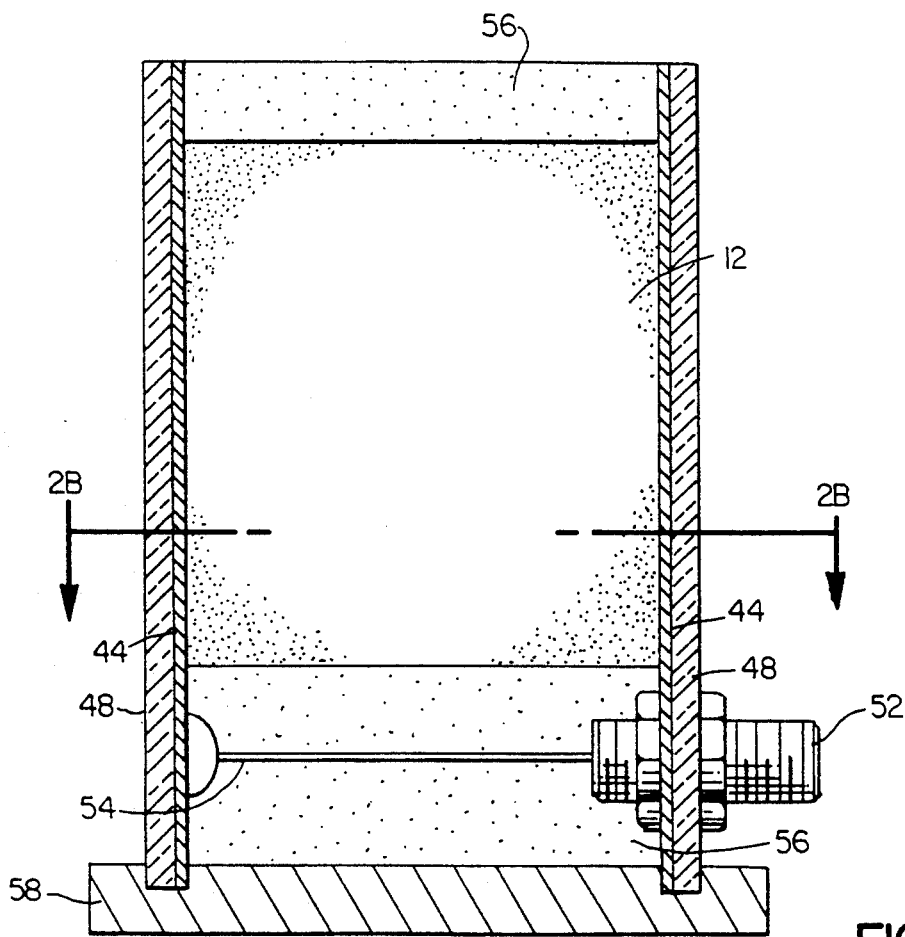

A practical arrangement of the cube 12 is illustrated in FIGS. 2A and 2B. The cube is provided with a confinement vessel 46 in which four glass walls 48 are each formed of fine annealed BK7 glass. Outer surfaces of these walls are provided with antireflection coating. Here the electrodes 44 are provided on two oppositely disposed walls 48 and are formed as an indium-tin-oxide transparent conductive coating. At the base of one of these two walls, a gold-coated SMA connector 52 has its outer conductor connected to the respective electrode 44, and has a center conductor 54 extending to the electrode on the opposite wall 48 where it is attached with silver-filled epoxy. Above the connector 52 is situated the cubic volume 12 of bacteriorhodopsin that has been field oriented, and supported in a polyacrylamide gel. Two strata of a low dielectric non-conducting polymer 56 are disposed respectively above and below the volume 12 and seal off the confinement vessel, which is affixed onto a grounded aluminum base plate 58.

A key requirement of the two-photon memory is to generate an irradiated volume which is reproducible in terms of xyz location over lengths as large as 2 cm. In the present case, the cube 12 is about 1.6 cm in the x and y dimensional and about 2 cm in the z direction. These dimensions are variable up to 2 cm on all sides, and can be as small as 1 cm on a side depending upon the desired storage capacity of the device. By using the arrangements 16, 18 of fixed lasers and lenses, and moving the cube 12 by means of orthogonal translation stages, excellent reproducibility can be achieved. Inhomogeneities which may develop within the protein-polymer cube from many repetitious of write cycles do not adversely effect the ability to position the irradiated volume with reproducibility. This is because the change in refractive index associated with the photochemical transformation is modest at 820 nm and is negligible at 1140 nm. Furthermore, by limiting the photochemical transformation to 60:40 versus 40:60 in terms of relative bR:M percentages, refractive index inhomogenities within the cube are minimized further.

That is, a reliable discrimination between a "1" state and a "0" state can be achieved where the relative amounts of bR to M state bacteriorhodopsin is 60:40 and 40:60, respectively.

The volume 12 of photoactive material can be prepared generally as described here. The purple membrane of Halobacterium halobium strain S9-P is grown, isolated and purified by standard procedures. The stock suspension of purple membrane washed with doubly distilled water is diluted with the acrylamide and N,N'-methylene-bisacrylamide to a final protein concentration of 300 $\mu$M (absorbance at 570 nm adjusted to 8-10). Additional chemicals can be added at this stage to control M state lifetime if desired. Polymerization of 300 $\mu$M of protein in 30% acrylamide and 0.8% bisacrylamide is catalyzed with 1.5% ammonium persulfate and initiated by TEMED (N,N,N'N' tetramethylethylenediamine) in order to complete even polymerization within ten minutes and to avoid the negative consequences of self-heating due to free radical formation. A second method is also used which employs 0.2% riboflavin as the catalyst and polymerization is initiated by a uv lamp. The first method is preferred under most circumstances because it is faster and more easily implemented. The bacteriorhodopsin acrylamide solution is then thoroughly mixed and poured into the desired electrophoresis chamber. The polymerization and electrophoresis are carried out at 4° C. in a cold room. An example of one chamber that is used consists of a Teflon base (3 cm $\times$ 1 cm) with platinum electrodes on either side. A voltage (20 V/cm) is used to orient the purple membrane sheets of bacteriorhodopsin. The protein carrying a negative charge, migrates towards the positively charged electrode (anode). The resulting hydrodynamic velocity achieves very high orientation and homogeneity. The purple membrane sheets orient with the cytoplasmic side facing the anode (cytoplasmic side charge = ~ —3). After electrophoresis and polymerization, the gel is carefully removed and bathed at 4° C. overnight in 200 mM potassium chloride or some other highly conductive ionic buffer, i.e. TRIS {(2-Hydroxyethyl)imino-tris(Hydroxymethyl)methane}, HEPES {N-(2-Hydroxyethyl) piperazine -N'- (2-ethanesulfonic acid)} or CAPS {2-Cyclohexylamino-1-propanesulfonic acid}. Using optical microscopy techniques, we observe and cut cubes only in those regions where there is greater than 99% homogeneity of protein distribution within the gel. The gel slab is then cut into cubes or rectangular solids that fit into the cell holder or confinement vessel.

To enhance M state lifetime we use various concentrations and combinations of the following chemicals; 1) guanidine hydrochloride, 2) ethylene diamine, 3) diamine propane, and 4) 1,4 diguanidinobutane sulfate salt (arcaine). A small amount of sodium azide (0.6% by weight) is added to prevent the growth of organisms. The chemically modified bacteriorhodopsin-acrylamide suspension is modified to a pH between 9.5 and 10.0. Polymerization and orientation is achieved in the same manner as above.

A data write operation is carried out by actuating the drive 14. The cube 12 is accurately moved to place a desired bit or memory cell at the location 20. In the initial two-photon write operation both laser diodes 22 and 32 are simultaneously fired to produce crossed beams at 1140 nm to write a "1" bit. If a "0" bit is desired both the laser diodes 24 and 34 are fired simultaneously to generate crossed beams at the location 20. This photochemically converts the bacteriorhodopsin at the desired bit cell to the desired bR or M state to produce the "1" or "0" respectively. One-photon induced photochemistry is negligible at 1140 nm and 820 nm. The two-photon absorption technique of data storage requires selection of a data element in three dimensions. It is the ability to control the location of the two-photon irradiated position 20 in three dimensions that distinguishes the two-photon absorption process from the one-photon absorption of prior proposed techniques for photochromic data storage. However, the bit cell at location 20 is not the only memory location within which two-photon induced photochromism occurs. The actual situation is shown in FIG. 4A which shows the probability of two-photon induced photochemistry as a function of location relative to the center of the irradiated location 20.

Figure 3A:
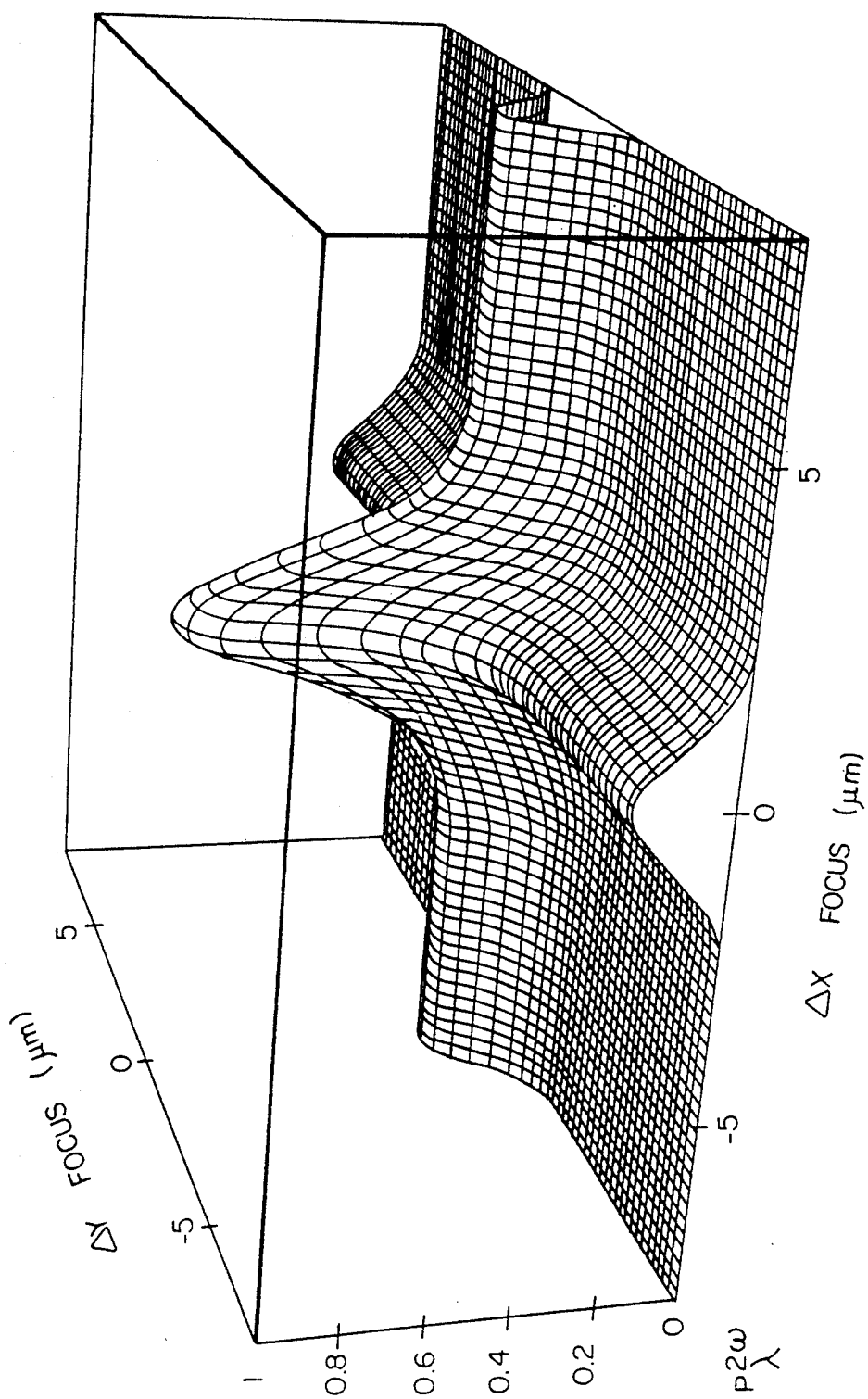
FIGS. 3A and 3B are charts showing a read laser pulse and the electrical behavior of the photoactive medium in response to the laser pulse.

As can be seen from an analysis of FIG. 3A photochemistry occurs outside of the irradiated volume along the laser beam axes. If nearby memory cells are transformed to about 25% of the transformation of the target memory cell at the location 20, repeated read/write operations may irreparably destroy the contents of unaddressed memory cells after multiple write operations. One of the key components of this invention is the procedure for eliminating this source of error.

Figure 3B:
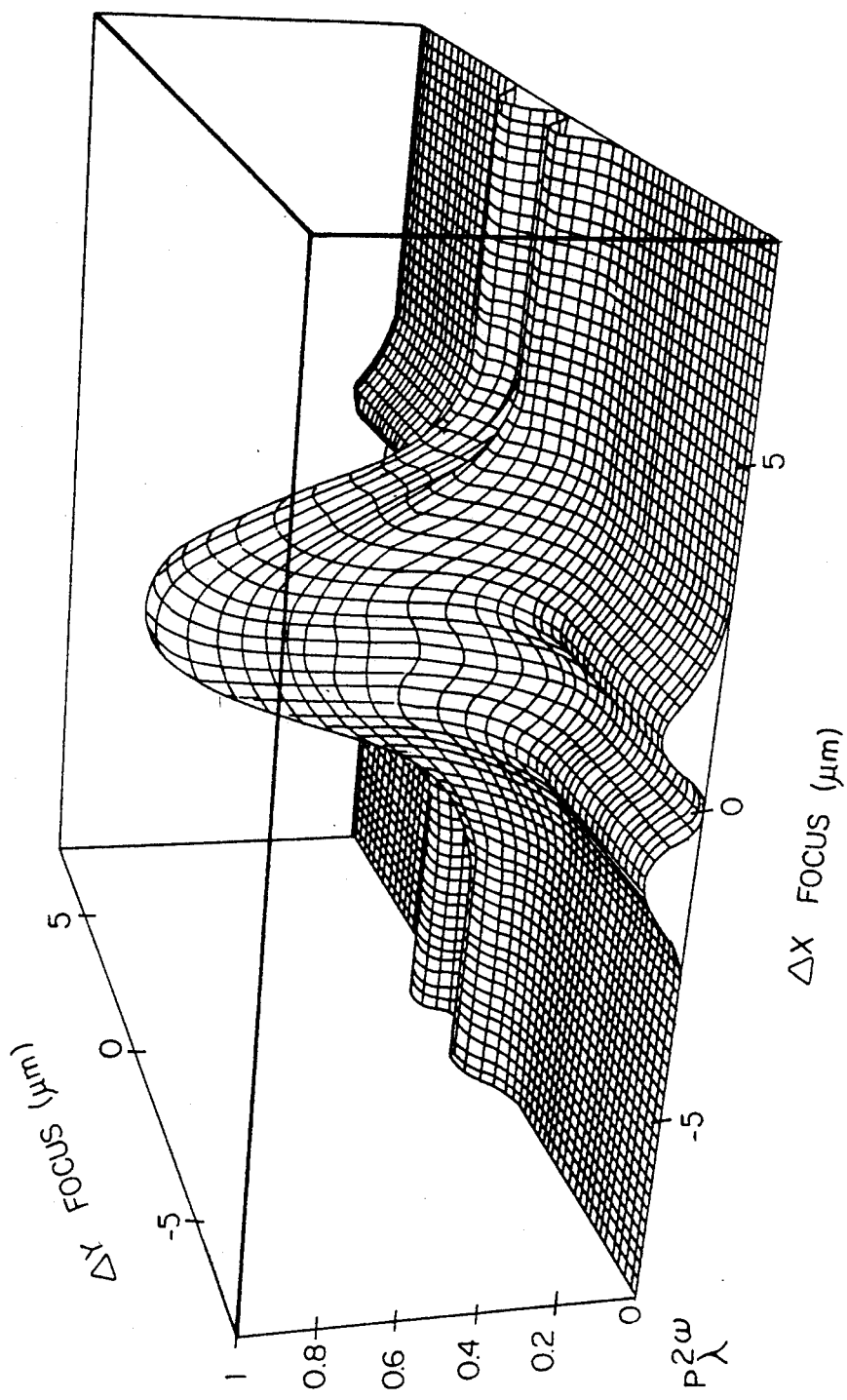

After the initial two-photon write operation, which involves the use of simultaneous laser excitation at 1140 nm (0→1) or 820 nm (1→0), two (non-simultaneous) cleaning pulses are fired without changing the location of the cube. If a 0→1 write operation was carried out, the 820 nm lasers are fired nonsimultaneously. If a 1→0 write operation was carried out, the 1140 nm lasers are fired nonsimultaneously. The intensity and/or duration of these "cleaning pulses" is adjusted to compensate as accurately as possible for the undesired photochemistry that occurred during the write operation. The end result of the cleaning operation is shown in FIG. 3B. The cleaning operation serves to reduce unwanted photochemistry from ~25% to ~2%, the latter level being more than adequate to maintain data integrity outside of the irradiated volume. The entire write operation, including the subsequent cleaning pulse, is complete in less than 50 ns, and in principle, can take less than 35 ns.

The use of diffraction-limited memory cells of three microns on a side yields nearest neighbor interference as high as ~18%. There are two methods of eliminating this problem. The first is to operate at lower storage densities, and use memory cell dimension of 6 microns on a side. This approach can be adopted when using voice-coil actuators. Alternatively, one can retain diffraction or near-diffraction limited performance by carrying out read/write enhancements on each of the nearest neighbor cells to regenerate the data. This must be done by using reduced laser intensities so that enhancement of nearest neighbor cells does not propagate error to other cells. This latter technique is used when the piezoelectric micrometer actuators are employed and data access speed is less important than maximizing density.

The read operation is carried out electrically; thus fluorescence of the interrogated memory cell is not required to monitor its binary state. The read process relies on observation of a photoelectric signal from which the state of the interrogated bit cell can be discriminated. In general terms, the first step is to carry out a "0" to "1" (or "1" to "0") write operation, in which both laser diodes 22 and 32 are fired. This generates a pair of crossing light pulses as represented by a pulse in FIG. 4A. The bacteriorhodopsin molecule responds by producing a negative-going electrical pulse B of FIG. 5, followed by a positive level C which decays after a somewhat longer period. A differential voltage appears across the electrodes 44, and the strength of the signal indicates the predominant state of the bacteriorhodopsin in the interrogated cell prior to this write operation.

In practice, there are two approaches to the read technique implemented, depending upon the speed requirements of the three-dimensional memory. The first method involves the simultaneous firing of all four laser diodes 22, 24, 32, 34 followed by the measurement of the resultant photoelectric signal. This method is referred to as the four laser read (FLR) method. A second approach involves the firing of only the two laser diodes 22, 32. This second method is referred to as the two laser read (TLR) method.

The FLR method is utilized when read speed is of critical importance. By firing all four lasers simultaneously, the state of the irradiated volume can be probed by monitoring the differential photovoltage B-C in FIG. 4B. If B-C is negative, then the memory cell defined by the irradiate volume is in the "0" state. If B-C is positive, then the memory cell defined by the irradiate volume is in the "1" state. Careful adjustment of the relative intensities of the four laser permits minimal disturbance of memory cells outside of the irradiate volume. A standard write operation is then performed to reset the memory cell to the correct state as just discriminated. This write operation includes a cleaning pulse operation. This procedure serves to enhance data integrity by reducing the risk that multiple read/write cycle along the axis occupied by the interrogated memory cell at location 20 might corrupt the data in that memory cell. The total read process can be completed in about 50 ns, which means that the maximum data rate is about 20 Mbit/s. This data rate is decreased by the time necessary to move the cube to the next memory cell. This latency is determined by the extent to which the data to be read are contiguous and by the speed of the translation actuators (i.e., piezoelectric versus voice-coil).

The TLR method is roughly two times slower than the FLR method, but is advantageous in terms of simplified firmware control circuitry. The TLR method is preferred when data throughput requirements are less severe and/or data integrity requirements are of dominant importance. The first step in the TLR operation is to carry out a "0" to "1" write operation and to measure the differential photovoltage (B-C). Then the two cleaning pulses are fired and the B-C voltage is measured during each cleaning pulse. If we assign the three voltage differential as $V_1$, $V_2$ and $V_3$, the state of the memory cell located within the irradiated volume is assigned as $V_1-(V_2+V_3)$. This result is diagnostic and is negative if the memory cell was in the "0" state and positive if the memory cell was in the "1" state. After the read operation is completed, a write operation is carried out to reset the bit to its original state. As was the case in the FLR method, the "refresh" procedure serves to enhance data integrity by reducing the risk that multiple read/write cycles along the axis occupied by the interrogated memory cell might corrupt the data in that memory cell. The total read process can be completed in about ~100 ns, and the maximum data transfer rate is about 10 Mbit/s. This data rate is decreased by the actuator latencies as described above.

To maximize reliability of both the FLR and TLR read operations, two additional bits are stored after each 8 bit byte to provide single-bit error correction and double-bit error detection. Additional data reliability can be provided by adding checksums at the end of each data block, but the checksum generation and verification process can be handled by controller software and not by the two-photon three-dimensional memory control firmware.

In a typical memory data storage system, a number of these memory elements 10 are situated in a common chassis or housing and can be operated in parallel. Adequate cooling means are provided to maintain the temperature of the cubes of active material at a suitable low temperature, preferably $-20°$ C.

In other embodiments, it is possible to construct the device as a two dimensional memory, which would be displaceable in the X and Y coordinates only, for example, although this mode would have a much more limited storage capacity. It may also be advantageous under some circumstances to employ other states of the bacteriorhodopsin molecule besides the bR and M states. Furthermore, while the described embodiment employs separate lasers for each wavelength in each of the X and Y direction, it is possible to use one laser of each wavelength and divide the beam with beam splitters. It is also possible to employ a tunable laser to generate beams of both wavelengths.

While this invention has been described in terms of specific embodiments, the invention is not limited to those precise embodiments. Rather, many modifications and variations would present themselves to those skilled in the art without departing from the scope and spirit of this invention, as defined in the appended claims.

What is claimed is:

1. Two-photon three dimensional optical data storage device comprising:

a volume of a field-oriented bacteriorhodopsin disposed in a carrier medium, confining means holding said volume, and translating means for moving said confining means in each of a plurality of orthogonal directions;

first means for generating a beam of radiation at one or both of two predetermined wavelengths, along one predetermined axis and converging the radiation at a predetermined bit cell access location in the volume;

second means for generating another beam of radiation at one or both of said wavelengths along another predetermined axis and converging the radiation at said predetermined bit cell access location;

wherein illumination by one of said wavelengths is operative to place the bacteriorhodopsin in the bit cell to a "1" state; while illumination by the other of said wavelengths is operative to place the bacteriorhodopsin in the bit cell access location to a complementary "0" state;

transport electrode means disposed on walls of said confining means for sensing an electrical response of said bacteriorhodopsin to stimulation by illumination from said first means and said second means;

and control means coupled to said first means, said second means, and said electrode means for actuating a write sequence wherein when said volume is disposed with an addressed bit cell at said predetermined bit cell access location, said first and second means are both simultaneously actuated to inject radiation at one of said wavelengths into said access location, and then conducting a cleaning sequence in which said first and second means are actuated sequentially to inject radiation at the other of said wavelengths separately along their respective axes to reverse the state of some of the bacteriorhodopsin in the bit cells adjacent to said bit cell access location.

2. Two-photon three-dimensional optical data storage device of claim 1, wherein said control means conducts a read cycle by simultaneously actuating said first and second means both to inject radiation of said one wavelength, and sensing the electrical response of said electrode means, and discriminating the "1" or "0" state of the bit cells at said bit cell access point on the basis of said electrical response.

3. Two-photon three-dimensional optical data storage device of claim 2, wherein during said read cycle said control means further conducts a cleaning sequence in which said first and second means are actuated in sequence to inject radiation of said other wavelength.

4. Two-photon three-dimensional optical data storage device of claim 2, wherein immediately after said read cycle, said control means is further operative to conduct a refresh write cycle by simultaneously actuating said first and second means both at whichever of the two wavelengths correspond to the state of the bit cell at said bit cell address location as discriminated on the basis of said electrical response, and then sequentially actuating said first and second means at the other of said two wavelengths.

5. Two-photon three-dimensional optical data storage device of claim 1 wherein said two predetermined wavelengths are nominally 1140 nm and 820 nm.

6. Two-photon three-dimensional optical data storage device of claim 1 wherein said volume is a cube on the order of about 2 cm in each dimension, and said confining means includes optical glass container walls.

7. Two-photon three-dimensional optical data storage device of claim 1 wherein said electrode means includes a transparent conductive coating on each of two of said glass container walls.

8. Two-photon three-dimensional optical data storage device of claim 1 wherein said volume includes bacteriorhodopsin field oriented in a polyacrylamide gel.

* * * * *